United States Patent
Berry

(10) Patent No.: US 7,211,888 B2
(45) Date of Patent: May 1, 2007

(54) ENCAPSULATION OF PIN SOLDER FOR MAINTAINING ACCURACY IN PIN POSITION

(75) Inventor: Michele J. Berry, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 10/626,117

(22) Filed: Jul. 23, 2003

(65) Prior Publication Data
US 2005/0275094 A1    Dec. 15, 2005

Related U.S. Application Data

(62) Division of application No. 09/965,555, filed on Sep. 27, 2001, now Pat. No. 6,974,765.

(51) Int. Cl.
*H01L 23/48* (2006.01)
(52) U.S. Cl. ......... 257/697; 257/788; 257/790; 257/792; 257/793; 257/E23.024; 257/E23.119
(58) Field of Classification Search ......... 257/737, 257/738, 772, 778, 697, 788, 790, 792, 793, 257/E23.024, E23.119; 438/613
See application file for complete search history.

(56) References Cited

U.S. PATENT DOCUMENTS

| | | | |
|---|---|---|---|
| 4,233,620 A | 11/1980 | Darrow et al. ............... 357/74 |
| 4,835,344 A | 5/1989 | Iyogi et al. ................. 174/68.5 |
| 5,196,251 A | 3/1993 | Bakhru et al. ............... 428/76 |
| 5,243,133 A * | 9/1993 | Engle et al. ............... 174/52.4 |
| 5,249,101 A * | 9/1993 | Frey et al. ................... 361/717 |
| 5,288,944 A | 2/1994 | Bronson et al. ........... 174/52.4 |
| 5,303,862 A | 4/1994 | Bross et al. ................ 228/175 |
| 5,414,928 A * | 5/1995 | Bonitz et al. ............... 29/840 |
| 5,469,333 A * | 11/1995 | Ellerson et al. ............ 361/779 |
| 5,708,056 A * | 1/1998 | Lindley et al. ............. 523/220 |
| 5,759,730 A * | 6/1998 | Hermansen et al. ........ 438/106 |
| 5,891,754 A * | 4/1999 | Bowles et al. ............. 438/108 |
| 5,943,217 A | 8/1999 | Hashimoto ................. 361/777 |
| 6,088,914 A | 7/2000 | Variot et al. ................. 29/840 |
| 6,209,196 B1 | 4/2001 | Ozono et al. |
| 6,229,207 B1 * | 5/2001 | Master ....................... 257/697 |
| 6,297,560 B1 | 10/2001 | Capote et al. .............. 257/778 |
| 6,353,182 B1 * | 3/2002 | Chang et al. ............... 174/52.2 |

(Continued)

FOREIGN PATENT DOCUMENTS

EP    0 556 550 A2 *    8/1993

(Continued)

OTHER PUBLICATIONS

"Pin Attachment to a Substrate," IBM Technical Disclosure Bulletin, vol. 25, Issue No. 4, Sep. 1, 1982, p. 1800.*

(Continued)

*Primary Examiner*—M. Wilczewski
*Assistant Examiner*—Toniae M. Thomas
(74) *Attorney, Agent, or Firm*—Schwegman, Lundberg, Woessner & Kluth, P.A.

(57) ABSTRACT

Solder joints coupling pins to a microelectronic package substrate are enshrouded with an encapsulation material. In this manner, pin movement is limited even if the pin solder subsequently melts.

28 Claims, 5 Drawing Sheets

U.S. PATENT DOCUMENTS

| | | | |
|---|---|---|---|
| 6,578,755 B1 * | 6/2003 | Elenius et al. | 228/254 |
| 6,610,559 B2 * | 8/2003 | Wang et al. | 438/108 |
| 6,803,639 B2 * | 10/2004 | Ono et al. | 257/433 |
| 6,974,765 B2 | 12/2005 | Berry | |
| 2002/0098609 A1 * | 7/2002 | Ono et al. | 438/31 |
| 2002/0140059 A1 * | 10/2002 | Yamazaki et al. | 257/658 |
| 2004/0126927 A1 * | 7/2004 | Lin et al. | 438/107 |
| 2004/0180471 A1 * | 9/2004 | Matsuura et al. | 438/107 |

FOREIGN PATENT DOCUMENTS

| | | |
|---|---|---|
| EP | 0631311 | 12/1994 |
| EP | 0631311 A2 | 12/1994 |
| JP | 09-045844 | 2/1997 |
| JP | 09-102560 | 4/1997 |
| JP | 09-129769 | 5/1997 |
| JP | 09-129778 | 5/1997 |

OTHER PUBLICATIONS

"International Preliminary Report on Patentability for corresponding PCT Application No. PCT/US02/30625", (Feb. 9, 2006), 5 pgs.

"International Search Report for corresponding PCT Application No. PCT/US02/30625", (Aug. 6, 2003), 5 pgs.

"Written Opinion for Corresponding PCT Application No. PCT/US02/30625", (Jul. 8, 2005), 5 pgs.

Written Opinion for PCT/US02/30625.

"Examination Report for European Application No. 027996438", (Aug. 25, 2006), 7 pgs.

"Office Action in Chinese Application No. 02819054.8", (Received Jun. 9, 2006), 9 pgs.

* cited by examiner

ENCAPSULATION OF PIN SOLDER FOR MAINTAINING ACCURACY IN PIN POSITION

This application is a divisional of U.S. patent application Ser. No. 09/965,555, filed Sep. 27, 2001 now U.S. Pat. No. 6,974,765, which is incorporated herein by reference.

FIELD OF THE INVENTION

The invention relates generally to microelectronic circuits and, more particularly, to packaging of microelectronic circuits.

BACKGROUND OF THE INVENTION

In many pin grid array (PGA) packaging processes, the pins are attached to the package substrate before the corresponding die is mounted. During the subsequent die attach process, the solder connecting the pins to the substrate can melt if the associated processing temperatures are too high. If the pin solder melts, the pins can wiggle and move out of the positional ranges required for socket insertion. To prevent the pin solder from melting, lower temperature solders have traditionally been used during die attach processing so that the melting temperature of the pin solder is not exceeded. However, it is becoming more popular to use higher melting temperature solders (e.g., lead free solders) during the die packaging process. The use of such solders makes it increasingly difficult to avoid melting pin solder during packaging of microelectronic circuits.

DETAILED DESCRIPTION

Figure 1:
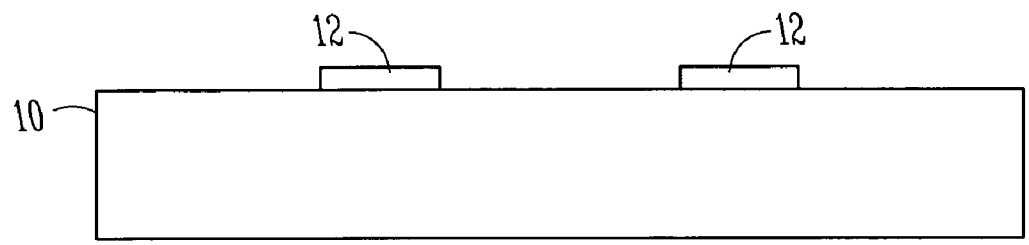
FIGS. 1, 2, 3, 4, and 5 are a series of simplified cross-sectional side views illustrating a method for attaching pins to a microelectronic package substrate in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to methods and structures that can be used to limit movement of the pins of a microelectronic package when pin solder melts during, for example, a die attach process. A solid material is used to surround the solder joint associated with a pin so that movement of the pin is constrained even when the solder melts. Thus, the pins remain in the positional ranges required for socket insertion through out the packaging process. The inventive principles can be used in connection with a wide variety of microelectronic devices that utilize pins on a device package to provide electrical connection to an external circuit (e.g., devices using PGA's). The inventive principles are particularly beneficial for use in packaging processes that utilize high temperature (e.g., lead free) solders during die attach.

Figure 2:
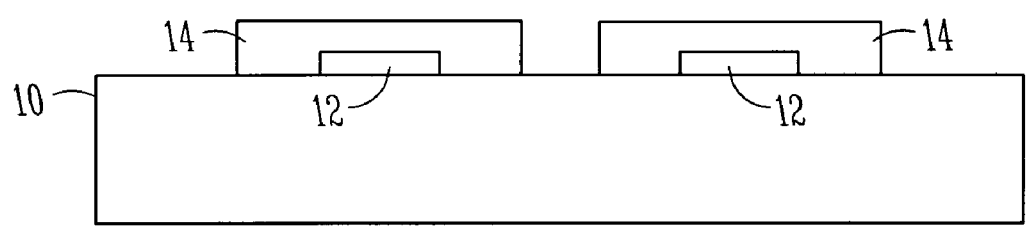

FIGS. 1–5 are a series of simplified cross-sectional side views illustrating a method for attaching pins to a package substrate in accordance with an embodiment of the present invention. With reference to FIG. 1, a substrate 10 is provided that has pin attach contact pads 12 disposed on a surface thereof. As illustrated in FIG. 2, a polymer material 14 (e.g., an encapsulation material) is deposited on the substrate 10 over the contact pads 12. In at least one embodiment, the polymer material 14 is screen printed on the substrate 10. Any of a variety of other deposition techniques can alternatively be used to deposit the polymer material 14 including, for example, spray coating, liquid dispense, and film lamination. As illustrated in FIG. 2, in one approach, a separate portion of polymer material 14 is applied to each individual contact pad 12 on the substrate 10. In another approach, the polymer material 14 is applied to the contact pads 12 in predefined groups. In yet another approach, a single layer of polymer material 14 is used to cover all of the contact pads 12 on the substrate 10. As will be appreciated, the invention is not limited by the application pattern of the polymer material 14. Although not illustrated, openings or depressions may be provided in the polymer material 14 in the desired pin locations.

Figure 3:
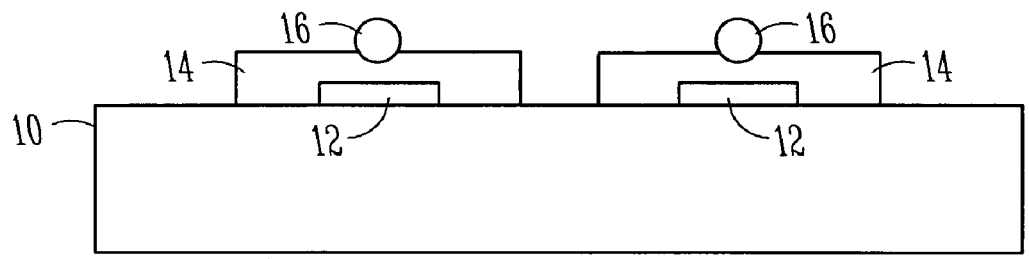

After the polymer material 14 has been deposited, solder balls 16 (or a similar form of solder element) are placed into the polymer material 14 in locations corresponding to the desired pin locations, as illustrated in FIG. 3. In one approach, the solder balls 16 are physically pressed into the polymer material 14 using mechanical means (e.g., a jig). In another approach, molten solder is dropped onto the polymer material 14 in the desired locations. If openings or depressions are provided in the polymer material 14, the solder balls 16 may be deposited into the openings or depressions. In a preferred technique, all of the solder balls 16 are applied simultaneously.

Figure 4:
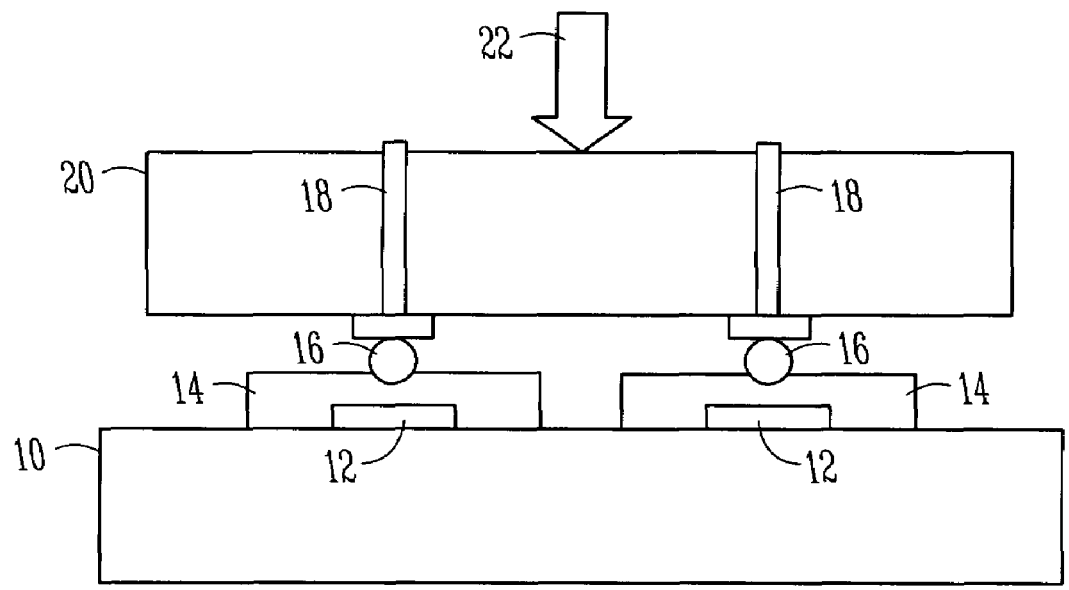
Figure 5:
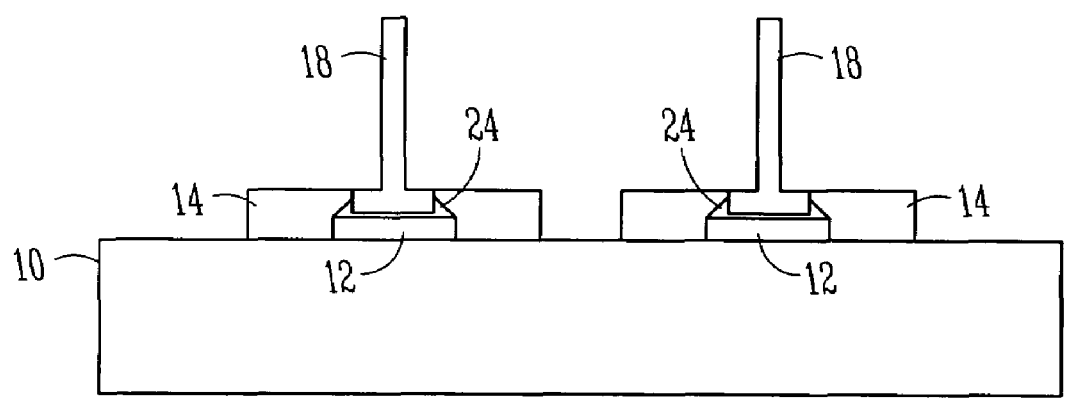

After the solder balls 16 are in place, the pins 18 are attached. As shown in FIG. 4, in one embodiment, the pins 18 are loaded into a jig 20 that holds the pins 18 in fixed relation to one another. It should be appreciated that individual placement of the pins 18 is also possible (i.e., placement without the use of a jig) in accordance with the invention. The jig 20 is placed over and aligned with the substrate 10 so that the pins 18 align with the corresponding contact pads 12. The assembly is heated to an appropriate temperature (typically a fixed amount higher than the melting temperature of the pin solder) and a force 22 is applied to the jig 20 in the direction of the substrate 10. In one approach, the force of gravity is all that is used. In another approach, an additional external force is applied to the jig 20 to ensure that the solder associated with each pin 18 wets the corresponding contact pad 12, rather than simply floating within the polymer material 14. Although not shown, guides may be used to prevent lateral movement of the jig 20 as it moves toward the substrate 10. After the pins 18 have contacted the corresponding contact pads 12, the assembly is allowed to cool during which time the polymer material 14 cures. After sufficient cooling has occurred, the jig 20 is removed and the assembly of FIG. 5 results. As illustrated in FIG. 5, each pin 18 is coupled to a contact pad 12 at a corresponding solder joint 24. Significantly, the polymer material 14 has cured about the solder joints 24 in a manner that will constrain the movement of the associated pins 18 should the pin solder melt during subsequent processing.

The polymer material 14 that is used in the above-described process should be one that allows a pin 18 and its associated solder to penetrate through the material 14 when pressure is applied, as shown in FIG. 4. The polymer material 14 should also be a material that, once cured, will maintain its shape and structural integrity even if relatively high temperatures are subsequently encountered. In at least one embodiment, a polymer material 14 is used that also has fluxing capabilities to facilitate the formation of the solder joints 24. As will be appreciated, the use of a polymer material 14 with fluxing capabilities may dispense with the need to apply a separate flux material during the pin attach process, thus reducing associated processing costs. In one approach, any of a number of commercially available "no flow" materials are used as the polymer material 14. These materials can include, for example, Cookson 2071E, Questech EF71 or LF-8, Advanced Polymer Solutions (APS) UFR 1.0 to 1.5, Kester Solder SE-CURE® 9101, Emerson & Cuming RTP-100-1, Sumotomo CRP 4700, and Loctite FF2000 and FF2200.

Figure 6:
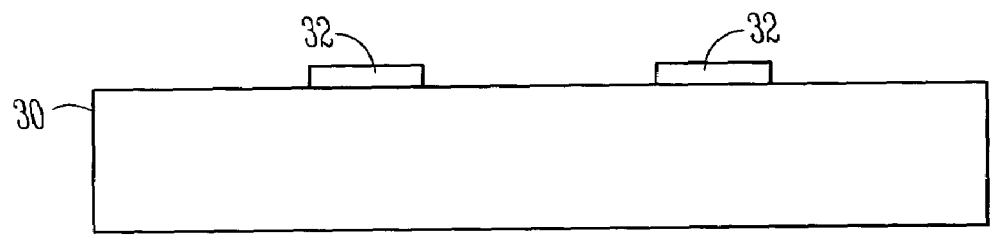
FIGS. 6, 7, 8, 9, and 10 are a series of simplified cross-sectional side views illustrating a method for attaching pins to a microelectronic package substrate in accordance with another embodiment of the present invention.
Figure 7:
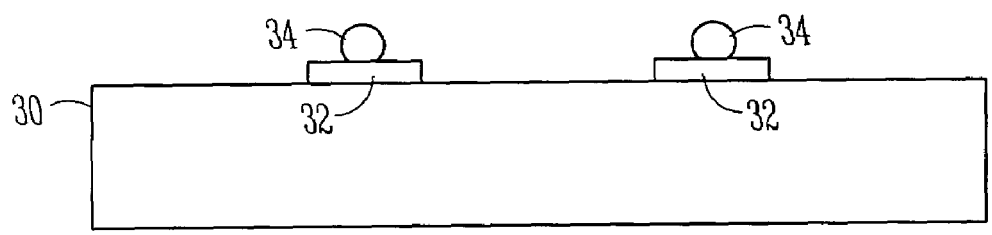
Figure 8:
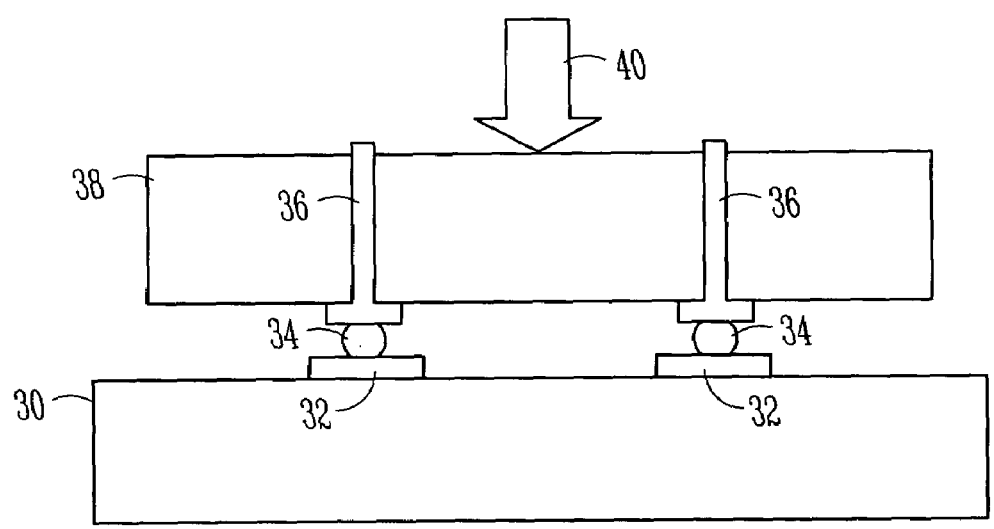
Figure 9:
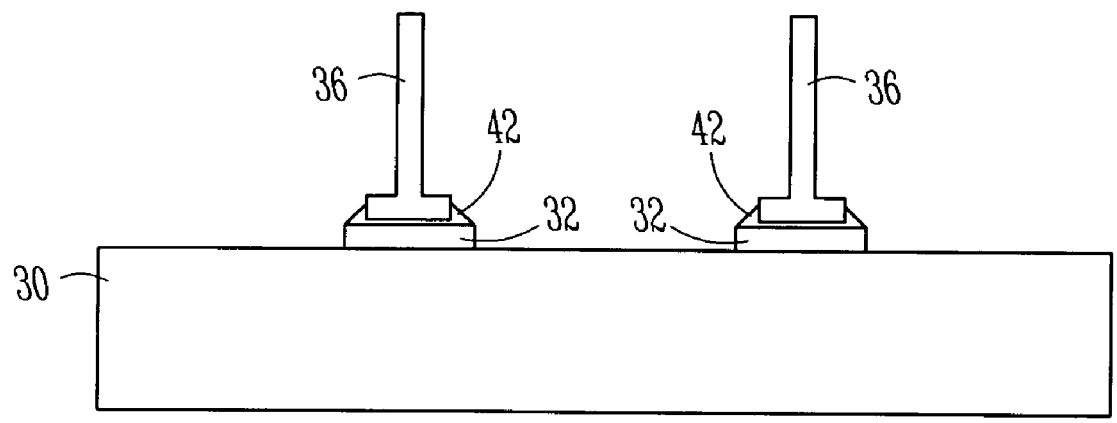
Figure 10:
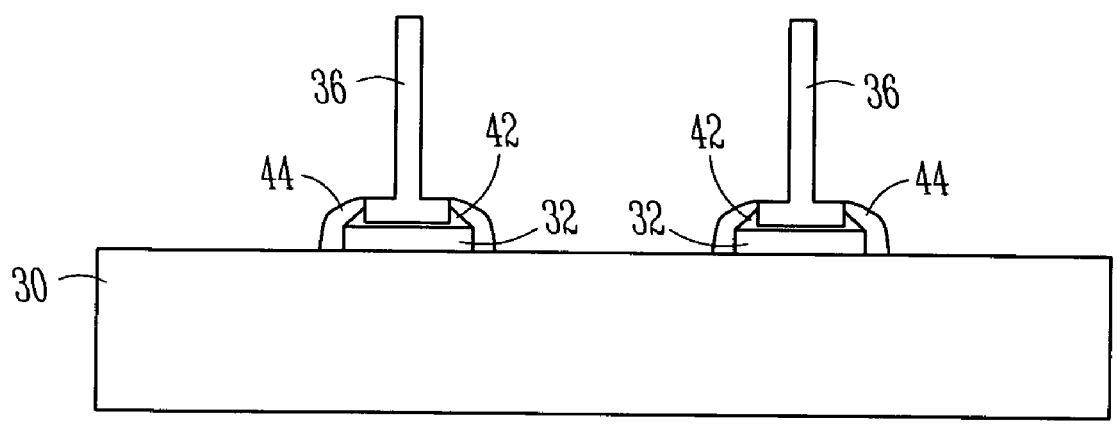

FIGS. 6–10 are a series of simplified cross-sectional side views illustrating a method for attaching pins to a package substrate in accordance with another embodiment of the present invention. With reference to FIG. 6, a substrate 30 is provided that has pin attach contact pads 32 disposed on a surface thereof. Solder bumps 34 (or similar solder structures) are deposited on the contact pads 32, as illustrated in FIG. 7 (alternatively, the solder can be applied to the contact surfaces of the pins 36 or to both the pins 36 and the contact pads 32). With reference to FIG. 8, the pins 36 are loaded into a jig 38 that is placed over and aligned with the substrate 30 (individual pin placement is also possible). The assembly is then heated to an appropriate temperature and a force 40 is applied to the jig 38 in the direction of the substrate 30. As before, the force 40 can be gravity or an externally applied force. The assembly is then allowed to cool and the jig 38 is removed, resulting in the structure of FIG. 9. As shown in FIG. 9, each of the pins 36 is conductively coupled to a contact pad 32 at a corresponding solder joint 42. As illustrated in FIG. 10, an encapsulation material 44 is next applied to the assembly in a manner that enshrouds the solder joint 42 associated with each pin 36. The encapsulation material 44 is then allowed to cure to a hardened state before subsequent processing steps are undertaken. Similar to the previous embodiment, the hardened encapsulation material 44 will constrain the movement of the pins 36 should the associated pin solder melt during subsequent processing.

Any of a wide range of encapsulation materials 44 can be used in the above-described process. In one approach, for example, any of the materials normally used as underfill in microelectronic assemblies may be used as the encapsulation material 44. This can include, for example, epoxy materials, polyimide materials (e.g., SPARK®), Dow Chemical BCB (e.g., Cyclotene®), Dexter CNB 868-10, and SEC 5230JP or 5114. In another approach, an injection molding compound is used as the encapsulation material 44. As illustrated in FIG. 10, in at least one embodiment, the encapsulation material 44 is selectively applied to the solder joints of the individual pins 36. This can be accomplished using, for example, a liquid dispense process to deposit the encapsulation material 44. A number of other deposition techniques may alternatively be used to deposit the encapsulation material 44 including, for example, injection molding, spray coating, film coating, and others. In another approach, a single layer of encapsulation material 44 is used to enshroud the solder joints 42 of all of the pins 36 on the substrate 30. Other techniques are also possible.

Figure 11:
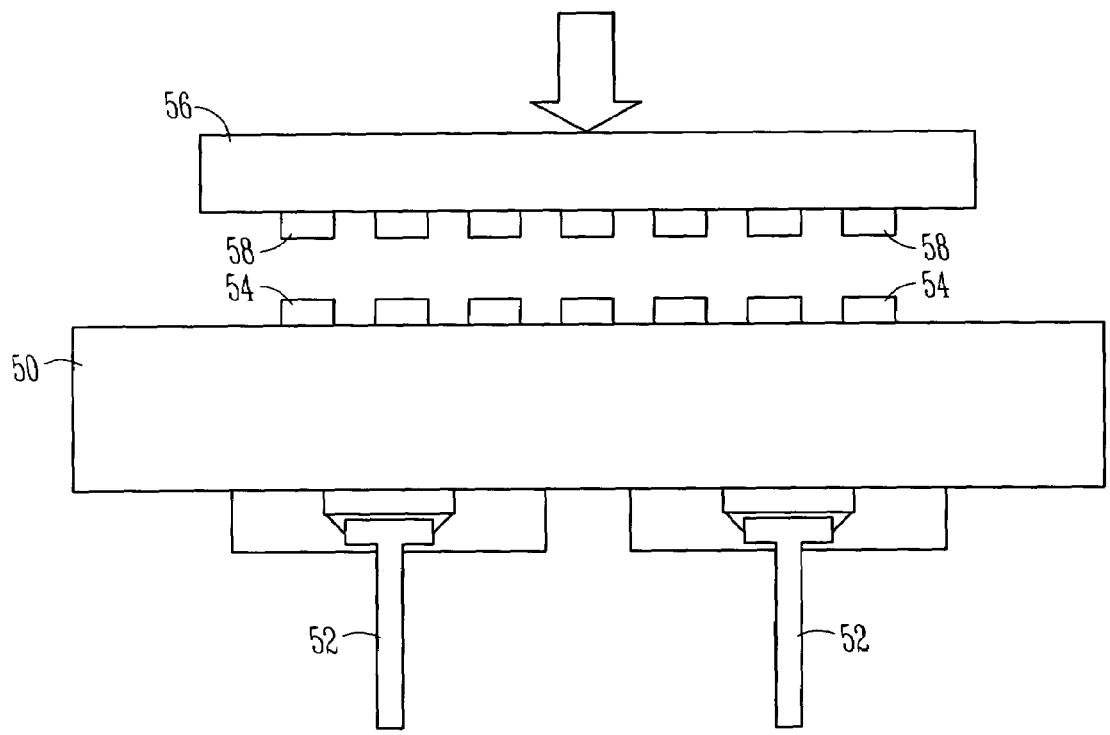
FIGS. 11 and 12 illustrate a die attach technique that can be used in accordance with the present invention.
Figure 12:
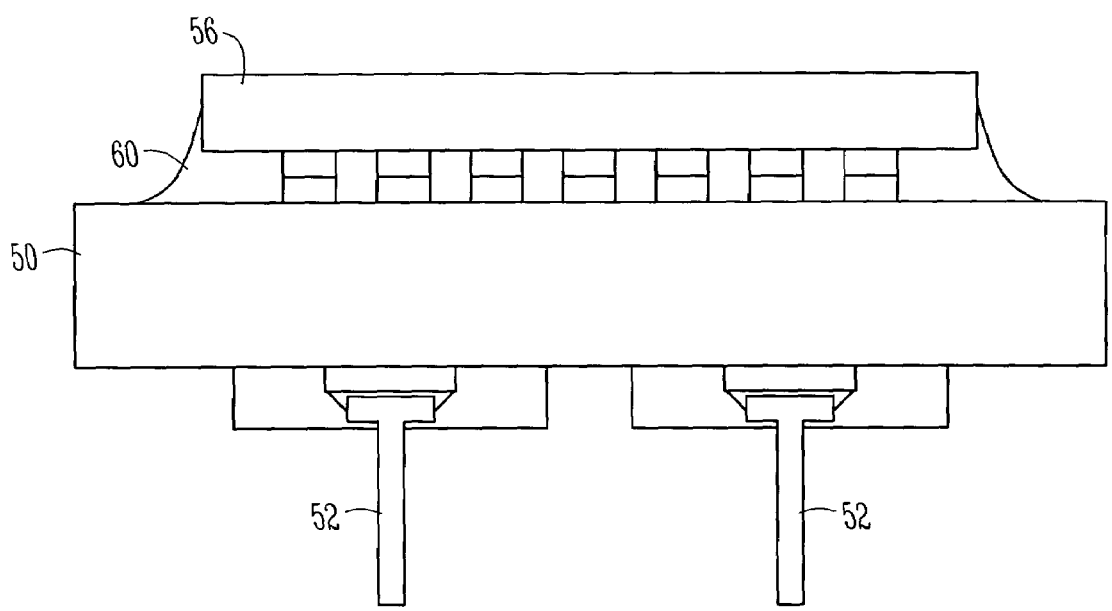

After the pins of a microelectronic package have been attached to the package substrate, the microelectronic die can be attached to the substrate. Often, the pins will be attached by a package vendor while the die is attached by the microelectronic device manufacturer. Other scenarios are also possible. FIGS. 11 and 12 illustrate one possible die attach process that can be used in accordance with the present invention. It should be appreciated that many other die attach techniques can alternatively be used. As illustrated in FIG. 11, a substrate 50 is provided that already has pins 52 attached to a first surface thereof. The substrate 50 also has a number of die attach contact pads 54 disposed upon a second surface thereof. A microelectronic die 56 is provided that includes a number of pads 58 on a surface thereof The pads 58 on the die 56 can include, for example, solder bumps that are attached to underlying bond pads on the die 56. In at least one embodiment of the invention, a high melting temperature, lead-free solder is used to connect the die 56 to the substrate 50. As illustrated in FIG. 11, the die 56 is positioned above and aligned with the substrate 50. The temperature of the components is increased to an appropriate level (typically a fixed amount higher than the melting temperature of the die solder) and the die 56 is brought into contact with the substrate 50 so that the pads 58 on the die 56 are coupled to corresponding contact pads 54 on the substrate 50. The assembly is then allowed to cool. As illustrated in FIG. 12, an underfill material 60 may be injected into the die interconnect region to provide additional structural rigidity to the assembly.

Although FIGS. 1–12 illustrate various views and embodiments of the present invention, these figures are not meant to portray microelectronic assemblies in precise detail. For example, these figures are not typically to scale. Rather, these figures illustrate microelectronic assemblies in a manner that is believed to more clearly convey the concepts of the present invention.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A substrate for use in a microelectronic circuit package, comprising:

a plurality of pin contact pads on a first surface of said substrate;

a plurality of individual pins soldered to respective individual pin contact pads on said first surface of said substrate; and a separate portion of encapsulation material surrounding a solder joint associated with each of said individual pins to prevent movement of said individual pins when said substrate is subjected to high temperatures.

2. The substrate of claim 1, wherein:
said encapsulation material includes a polymer material.

3. The substrate of claim 1, wherein:
said encapsulation material includes a no flow material.

4. The substrate of claim 1, wherein:
said encapsulation material is selected from the group consisting of one or more of epoxy materials, polyimide materials, SPARK®, Dow Chemical BCB, Cyclotene®, Dexter CNB 868-10, SEC 5230JP or 5114, and an injection molding compound, in any combination.

5. A microelectronic device comprising:
a package substrate having pin contact pads on a first surface thereof;
a plurality of individual pins soldered to respective individual pin contact pads on said first surface of said package substrate;
a separate portion of encapsulation material surrounding a solder joint associated with each of said individual pins to prevent movement of said individual pins when said microelectronic device is subjected to high temperatures; and
a microelectronic die connected to said package substrate, said microelectronic die having bond pads that are conductively coupled to said individual pins through said package substrate.

6. The microelectronic device of claim 5 wherein:
said microelectronic die is connected to said package substrate using a lead free solder having a relatively high melting temperature.

7. The microelectronic device of claim 5 wherein:
said encapsulation material includes a polymer material.

8. The microelectronic device of claim 5 wherein:
said encapsulation material includes a no flow material.

9. The microelectronic device of claim 5 wherein:
said encapsulation material is selected from the group consisting of one or more of epoxy materials, polyimide materials, SPARK®, Dow Chemical BCB, Cyclotene®, Dexter CNB 868-10, SEC 523JP or 5114, and an injection molding compound, in any combination.

10. The substrate of claim 2 wherein:
said polymer material comprises a cured polymer material.

11. The substrate of claim 2 wherein:
said polymer material has fluxing capabilities.

12. The substrate of claim 2 wherein:
said polymer material is selected from the group consisting of one or more of Cookson 2071E, Questech EF71 or LF-8, Advanced Polymer Solutions (APS) UFR 1.0 to 1.5, Kester Solder SE-CURE® 9101, Emerson & Cuming RTP-100-1, Sumotomo CRP 4700, and Loctite FF2000 and FF2200, in any combination.

13. The microelectronic device of claim 7 wherein:
said polymer material comprises a cured polymer material.

14. The microelectronic device of claim 7 wherein:
said polymer material has fluxing capabilities.

15. The microelectronic device of claim 7 wherein:
said polymer material is selected from the group consisting of one or more of Cookson 2071E, Questech EF71 or LF-8, Advanced Polymer Solutions (APS) UFR 1.0 to 1.5, Kester Solder SE-CURE® 9101, Emerson & Cuming RTP-100-1, Sumotomo CRP 4700, and Loctite FF2000 and FF2200, in any combination.

16. The microelectronic device of claim 5 wherein:
said microelectronic die is attached to said package substrate with a plurality of die attach contact pads on the package substrate in contact with a corresponding plurality of solder bumps on bond pads on a surface of said microelectronic die, the solder bumps comprising a high melting temperature, lead-free solder.

17. The microelectronic device of claim 5, further comprising:
underfill material between said microelectronic die and said package substrate.

18. A substrate for use in a microelectronic circuit package, comprising:
a plurality of pin contact pads on a first surface of said substrate;
a plurality of pins soldered to said pin contact pads on said first surface of said substrate; and
a cured polymer material about solder joints associated with said pins wherein a separate portion of said cured polymer material enshrouds an individual solder joint associated with each of said pins.

19. The substrate of claim 18 wherein:
said cured polymer material has fluxing capabilities.

20. The substrate of claim 18 wherein:
said cured polymer material is selected from the group consisting of one or more of Cookson 2071E, Questech EF71 or LF-8, Advanced Polymer Solutions (APS) UFR 1.0 to 1.5, Kester Solder SE-CURED® 9101, Emerson & Cuming RTP-100-1, Sumotomo CRP 4700, and Loctite FF2000 and FF2200, in any combination.

21. The substrate of claim 18, further comprising:
a microelectronic die attached to the substrate.

22. A microelectronic device comprising: a package substrate having pin contact pads on a first surface thereof; a plurality of pins soldered to said pin contact pads on said first surface of said package substrate; a cured polymer material about solder joints associated with said pins; a microelectronic die connected to said package substrate, said microelectronic die having bond pads that are conductively coupled to said pins through said package substrate; and underfill material between said microelectronic die and said package substrate, wherein a separate portion of said cured polymer material enshrouds an individual solder joint associated with each of said pins.

23. A microelectronic device comprising: a package substrate having pin contact pads on a first surface thereof; a plurality of pins soldered to said pin contact pads on said first surface of said package substrate; a cured polymer material about solder joints associated with said pins; a microelectronic die connected to said package substrate, said microelectronic die having bond pads that are conductively coupled to said pins through said package substrate; and wherein a separate portion of said cured polymer material enshrouds an individual solder joint associated with each of said pins, said cured polymer material having fluxing capabilities.

24. A device comprising: a package substrate having pin contact pads on a first surface thereof; a plurality of pins soldered to said pin contact pads on said first surface of said package substrate; a cured polymer material about solder joints associated with said pins; a microelectronic die connected to said package substrate, said microelectronic die having bond pads that are conductively coupled to said pins through said package substrate; and wherein a separate portion of said cured polymer material enshrouds an individual solder joint associated with each of said pins, said cured polymer material is selected from the group consisting of one or more of Cookson 2071 E, Questech EF71 or LF-8, Advanced Polymer Solutions (APS) UFR 1.0 to 1.5, Kester Solder SE-CURE® 9101, Emerson & Cuming RTP-100-1, Sumotomo CRP 4700, and Loctite FF2000 and FF2200, in any combination.

25. A microelectronic device comprising:
   a package substrate having pin contact pads on a first surface thereof;
   a plurality of pins soldered to said pin contact pads on said first surface of said package substrate;
   a cured polymer material about solder joints associated with said pins;
   a microelectronic die connected to said package substrate, said microelectronic die having bond pads that are conductively coupled to said pins through said package substrate; and
   wherein a separate portion of said cured polymer material enshrouds an individual solder joint associated with each of said pins.

26. A microelectronic device comprising: a package substrate having pin contact pads on a first surface thereof; a plurality of pins soldered to said pin contact pads on said first surface of said package substrate; a cured polymer material about solder joints associated with said pins; a microelectronic die connected to said package substrate, said microelectronic die having bond pads that are conductively coupled to said pins through said package substrate; and wherein said microelectronic die is attached to said package substrate with a plurality of die attach contact pads on the package substrate in contact with a corresponding plurality of solder bumps on bond pads on a surface of said microelectronic die, the solder bumps comprising a high melting temperature, lead-free solder, wherein a separate portion of said cured polymer material enshrouds an individual solder joint associated with each of said pins.

27. A substrate for use in a microelectronic circuit package, comprising:
   a plurality of pin contact pads on a first surface of said substrate; a plurality of pins soldered to said pin contact pads on said first surface of said substrate; and a cured polymer material about solder joints associated with said pins wherein a separate portion of said cured polymer material enshrouds an individual solder joint associated with each of said pins, said cured polymer material having fluxing capabilities.

28. A substrate for use in a microelectronic circuit package, comprising:
   a plurality of pin contact pads on a first surface of said substrate; a plurality of pins soldered to said pin contact pads on said first surface of said substrate; and a cured polymer material about solder joints associated with said pins wherein a separate portion of said cured polymer material enshrouds an individual solder joint associated with each of said pins, said cured polymer material ie selected from the group consisting of one or more of Cookson 2071 E, Questech EF71 or LF-8, Advanced Polymer Solutions (APS) UFR 1.0 to 1.5, Kester Solder SE-CURE® 9101, Emerson & Cuming RTP-100-1, Sumotomo CRP 4700, and Loctite FF2000 and FF2200, in any combination.

\* \* \* \* \*

UNITED STATES PATENT AND TRADEMARK OFFICE
CERTIFICATE OF CORRECTION

| | | |
|---|---|---|
| PATENT NO. | : 7,211,888 B2 | Page 1 of 1 |
| APPLICATION NO. | : 10/626117 | |
| DATED | : May 1, 2007 | |
| INVENTOR(S) | : Berry | |

It is certified that error appears in the above-identified patent and that said Letters Patent is hereby corrected as shown below:

In column 5, line 41, in Claim 9, delete "523JP" and insert -- 5230JP --, therefor.

In column 6, line 28, in Claim 20, delete "SE-CURED®" and insert -- SE-CURE® --, therefor.

In column 6, line 67, in Claim 24, after "material" delete "is".

In column 8, line 24, in Claim 28, after "material" delete "ie".

Signed and Sealed this

Tenth Day of July, 2007

JON W. DUDAS
*Director of the United States Patent and Trademark Office*